United States Patent
Norrie

(10) Patent No.: US 9,235,488 B2
(45) Date of Patent: Jan. 12, 2016

(54) SYSTEM AND METHOD FOR RANDOM NOISE GENERATION

(71) Applicant: PMC-SIERRA US, INC., Sunnyvale, CA (US)

(72) Inventor: Christopher I. W. Norrie, San Jose, CA (US)

(73) Assignee: PMC-SIERRA US, INC., Sunnyvale, CA (US)

( * ) Notice: Subject to any disclaimer, the term of this patent is extended or adjusted under 35 U.S.C. 154(b) by 112 days.

(21) Appl. No.: 14/168,222

(22) Filed: Jan. 30, 2014

(65) Prior Publication Data

US 2014/0281762 A1   Sep. 18, 2014

Related U.S. Application Data

(60) Provisional application No. 61/792,124, filed on Mar. 15, 2013.

(51) Int. Cl.

| G06F 11/22 | (2006.01) |
| H03M 13/39 | (2006.01) |
| H03M 13/11 | (2006.01) |
| G06F 11/10 | (2006.01) |

(52) U.S. Cl.
CPC ........ *G06F 11/2215* (2013.01); *G06F 11/1012* (2013.01); *H03M 13/1111* (2013.01); *H03M 13/3905* (2013.01); *H03M 13/3927* (2013.01)

(58) Field of Classification Search
CPC ...................... H03M 13/1111; H03M 13/3905; H03M 13/3927; H03M 13/1105; G06F 11/2215; G06F 11/1012
USPC .................................................. 714/752, 780
See application file for complete search history.

(56) References Cited

U.S. PATENT DOCUMENTS

| 7,904,793 | B2* | 3/2011 | Mokhlesi et al. ............. 714/780 |
| 8,341,502 | B2* | 12/2012 | Steiner et al. ................. 714/774 |
| 8,504,885 | B2* | 8/2013 | Haratsch et al. ............. 714/722 |
| 8,775,913 | B2* | 7/2014 | Haratsch et al. ............. 714/794 |
| 2005/0010846 | A1* | 1/2005 | Kikuchi et al. ............... 714/752 |
| 2011/0066902 | A1* | 3/2011 | Sharon et al. ................. 714/721 |
| 2011/0209031 | A1* | 8/2011 | Kim et al. ...................... 714/763 |
| 2013/0318422 | A1* | 11/2013 | Weathers et al. ............. 714/780 |
| 2014/0040704 | A1* | 2/2014 | Wu et al. ....................... 714/773 |
| 2014/0068368 | A1* | 3/2014 | Zhang et al. .................. 714/752 |
| 2014/0281767 | A1* | 9/2014 | Alhussien et al. ............ 714/721 |
| 2015/0149871 | A1* | 5/2015 | Chen et al. .................... 714/773 |

* cited by examiner

*Primary Examiner* — James C Kerveros
(74) *Attorney, Agent, or Firm* — Kenneth Glass; Molly Sauter; Glass & Associates

(57) ABSTRACT

A random noise generation module for generating noisy LLRs for testing an error correction circuit of a nonvolatile memory storage module. The random noise generation module includes a coefficient generator for generating one or a plurality of coefficients, each of the plurality of coefficients associated with one region of a plurality of regions defining a linear space proportionately divided according to an area under a probability distribution curve for a nonvolatile memory storage module. The random noise generation module further includes a linear random number generator for generating a linear random number and a comparator for comparing the linear random number to one or more of the plurality of coefficients to identify the region of the plurality of regions of the probability distribution curve in which the linear random number belongs to generate a noisy LLR for testing an error correction circuit of a nonvolatile memory storage module.

20 Claims, 5 Drawing Sheets

SYSTEM AND METHOD FOR RANDOM NOISE GENERATION

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. One commonly employed error correction code for nonvolatile memory storage modules, such as SSDs, is the low-density parity-check (LDPC) code. An LDPC code is a linear error correcting code having a parity check matrix with a small number of nonzero elements in each row and column. Soft-decision message passing algorithms are known in the art for decoding data encoded with LDPC error correction codes, such as the sum-product algorithm (SPA) and the min-sum algorithm. These soft-decision message passing algorithms are iterative in nature and attempt to decode the encoded data by assigning probability metrics to each bit in an encoded code word. The probability metrics indicate a reliability of each bit, that is, how likely it is that the bit read from the memory is not in error. These probability metrics are commonly referred to log likelihood ratios (LLRs) in the case of LDPC decoding. These LLRs values are often stored in LLR look-up tables, which are accessible by the NAND flash controller. To read the LDPC encoded data from the memory storage, a set of reference voltages are selected based upon the number of reads required and the number of bits used to represent the LLR value. The set of reference voltages selected determines the LLR values selected from the LLR look-up table.

The ability of an error correction circuit, such as an LDPC error correction circuit, to correct errors in a noisy channel is a critical performance parameter of a nonvolatile memory storage system. It is known in the art to test the performance of error correction circuits under an additive white Gaussian noise (AWGN) channel by generating AWGN samples that are used to access the LLR look-up tables of the nonvolatile memory storage system. However, noise generation circuits and techniques currently known in the art are very complex, requiring extensive mathematical functions to implement in logic gates. The noise generation circuits known in the art require a large area of space and the size of the circuitry increases as the number of required noise samples per clock cycle increases. As a result of the size and complexity of the noise generation circuits currently known in the art, it is commonly necessary to implement the AWGN generation circuitry in a dedicated FPGA (field-programmable gate array) or ASIC (application-specific integrated circuit) that is distinct from the encoding and decoding circuitry of the nonvolatile memory storage system.

Accordingly, what is needed in the art is an improved system and method for generating random noise samples for testing the error correction code circuitry of a nonvolatile memory system.

SUMMARY

In various embodiments, a nonvolatile memory system includes a nonvolatile memory storage module for storing encoded data. In one embodiment, the encoded data stored in the nonvolatile memory storage module is encoded by an encoder utilizing a low-density parity check (LDPC) error correction code and accessed by a nonvolatile memory storage controller. Read circuitry of the nonvolatile memory controller reads the encoded data stored in the nonvolatile memory storage module and provides the encoded data to a decoder. The decoder receives the LDPC encoded data previously stored in the nonvolatile memory storage module from the read circuitry and attempts to decode and recover the data.

A method is provided for generating one or more noise samples for testing an error correction circuit of a nonvolatile memory storage module. The method includes generating a plurality of coefficients, each of the plurality of coefficients associated with one region of a plurality of regions defining a linear space proportionately divided according to an area under a probability distribution curve for a nonvolatile memory storage module. After the coefficients have been generated, a sample is generated and the sample is compared to one or more of the plurality of coefficients to identify the region of the plurality of regions of the probability distribution curve in which the linear random number belongs, wherein each region of the plurality of regions of the probability distribution has an associated noisy log likelihood ratio (LLR). After the region has been identified for the sample, the method includes replacing the sample with the noisy LLR of the identified region to generate a noisy LLR for testing an error correction circuit of a nonvolatile memory storage module.

In generating the plurality of coefficients, the method may include identifying a probability distribution curve for the nonvolatile memory storage module, dividing the probability distribution curve into a plurality of regions, calculating the area under the probability distribution curve for each of the plurality of regions and dividing a linear space proportionately according to the area under the probability distribution curve for each of the plurality of regions to generate a plurality of coefficients, each coefficient associated with one region of the plurality of regions.

In a specific embodiment, the probability distribution curve is an additive white Gaussian noise (AWGN) probability distribution curve. In an additional embodiment, the probability distribution curve is dependent upon a desired bit error rate (BER) of the nonvolatile memory storage module.

In accordance with the present invention, a random noise generation module is provided for generating a noisy LLR for testing an error correction circuit of a nonvolatile memory storage module. The random noise generation module includes a coefficient generator configured to generate a plurality of coefficients, each of the plurality of coefficients associated with one region of a plurality of regions defining a linear space proportionately divided according to an area under a probability distribution curve for a nonvolatile memory storage module, wherein each region of the plurality of regions of the probability distribution has an associated noisy log likelihood ratio (LLR), and a comparator to compare a random number to one or more of the plurality of coefficients to identify the region of the plurality of regions of the probability distribution curve in which the random number belongs and to replace a random sample with the noisy LLR of the identified region to convert the random sample into a noisy LLR for testing an error correction circuit of a nonvolatile memory storage module.

In accordance with the present invention, a system for testing an error correction circuit of a nonvolatile memory storage module is disclosed that includes a random noise generation module for generating noisy LLRs for testing an error correction circuit of a nonvolatile memory storage module. The random noise generation module includes a coefficient generator configured to identify a probability distribution curve for the nonvolatile memory storage module, to divide the probability distribution curve into a plurality of regions, to calculate the area under the probability distribution curve for each of the plurality of regions and to divide a linear space proportionately according to the area under the probability distribution curve for each of the plurality of regions to generate a plurality of coefficients, each coefficient associated with one region of the plurality of regions, wherein each region of the plurality of regions of the probability distribution has an associated noisy log likelihood ratio (LLR). The random noise generation module further includes a comparator to compare a random number to one or more of the plurality of coefficients to identify the region of the plurality of regions of the probability distribution curve in which the random number belongs. The random noise generation module further includes a noisy LLR replacement module operable to replace the random sample with the noisy LLR of the identified region to generate a noisy LLR. The system further includes, a decoder coupled to the nonvolatile memory controller, the decoder configured to receive the one or more noisy LLRs from the random noise generation module and configured to decode an encoded codeword stored in the nonvolatile memory storage module to test the error correction code circuit of the nonvolatile memory storage module.

The generation of AWGN typically requires mathematical functions that are very difficult to implement in gates. Such complex circuits are very large, particularly if hundreds of samples are required per clock cycle. In accordance with the present invention, a random noise generation module is provided that converts a simple random number into a Gaussian sample without the use of complex circuitry. A set of coefficients are pre-determined by the random noise generation module that allow the non-linear mathematical functions to be converted into linear functions. The linear functions of the random noise generation module are dramatically simpler to implement in gates, compared to their non-linear counterparts. The coefficients are used to perform a binary search of a random number to generate a quantized sample. The number of coefficients determines the number of quantized regions of the Gaussian curve that are sampled. Even a small number of coefficients are useful in generating noise for testing and analyzing LDPC circuits. The circuitry for the random noise generation module of the present invention is minimal and may therefore be integrated onto the same integrated circuit device (e.g., a FPGA) that includes the encoding and decoding circuitry for a nonvolatile memory system.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
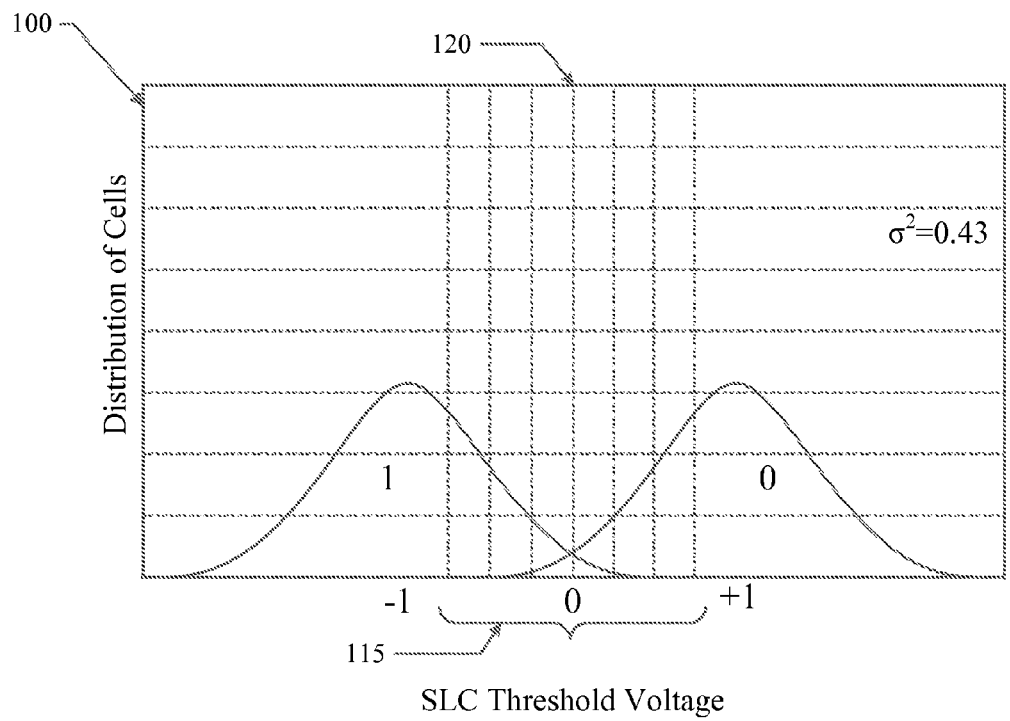
FIG. 1 is a graphical illustration of a possible threshold voltage distribution for a single-level memory cell in accordance with an embodiment of the invention.

A nonvolatile memory system used in a communication system may include a NAND-based flash memory system. While NAND-based flash memories are reliable, they are not inherently error-free and often rely on error correction codes (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the nonvolatile memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell, requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used.

An LDPC code is a linear error correcting code having a parity check matrix with a small number of nonzero elements in each row and column. LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired.

In the operation of a stored channel utilizing LDPC encoding, original data is stored in a nonvolatile memory storage module, such as a NAND-based flash memory. As a result of the channel, different noise sources estimated as Additive-White Gaussian Noise (AWGN) corrupt the original stored message resulting in a 1 becoming a 0 or vice versa. To improve the bit error rate (BER) the SSD controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process to recover the codeword.

FIG. 1 illustrates the threshold voltage distribution for a typical SLC (single-level cell) flash memory device at a particular point in the lifetime of the device. During the lifetime of the flash memory, the threshold voltage distributions may become distorted or shifted as a result of P/E cycling and loss of charge over time. As a result, the threshold voltage ranges may begin to overlap as illustrated with reference to FIG. 1. This overlap results in memory read errors which may be corrected utilizing LDPC encoding and decoding techniques. The power of LDPC codes resides in the ability of the decoding strategy to exploit the soft information of the stored data. Each NAND storage element can store one, or multiple, bits of data. In the case of a single-level cell (SLC), the NAND storage element is designed to store one bit of data. With reference to FIG. 1, at a BER of $10^{-2}$ and when the two midpoints of the two curves that identify binary 0 and binary 1 are separated by a value of 2, the probability distribution may be is described by a Gaussian curve with a sigma of approximately 0.43. The graph 100 of FIG. 1A illustrates a typical SLC threshold voltage distribution for a distribution of flash memory cells. As illustrated in the graph 100 of FIG. 1, the threshold voltage distribution of the SLC NAND cells is exemplified as a mixture of two Gaussian random variables. In particular, if a logical "1" is written to the cell, the threshold voltage is modeled as a Gaussian random variable centered at −1 and if a logical "0" is written to the cell, the threshold voltage is modeled as a Gaussian random variable centered at +1. When the voltage distributions overlap, errors arise. A hard-decision decoder will read all the values to the right of the reference voltage 120 as 0 and all the values to the left of the reference voltage as 1. So, in the situation depicted in the graph, the overlap region will be composed of read errors. However, the farther away the error points are from the reference voltage 120, the more probable it is that the cell contains the value that was stored. By exploiting the exact value of the error points, differentiation can be used between the points and better information can then be provided to the decoder, resulting in improved decoding performance of the decoder in the decoding the LDPC encoded codewords. Estimations of the exact value of the error points are referred to as soft information, which may be expressed by a log likelihood ratio (LLR). As such, error points are assigned a low magnitude LLR (probability) as a result of their close proximity to the reference voltage 120, whereas error points are assigned a moderate magnitude LLR (probability) as a result of their greater distance from the reference voltage 120. The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"'s and "1"'s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

The decoding of the LDPC codes is an iterative process that uses as input, the log likelihood ratio (LLR) of the received data bits in the codeword, as in the equation:

$$LLR(x) = \log\left[\frac{p(x \mid y = 0)}{p(x \mid y = 1)}\right] \quad (1)$$

where "y" is the read message and "x" is the original codeword. As such, the LLR for a particular read value of "y" is the logarithmic ratio between the probability that the bit of the original codeword "x" was a 0 given the read value "y" and the probability that the bit "x" was a 1 given the read value "y". As such, the magnitude of the LLRs measure the probability that the bit is read correctly vs. the probability that the bit is read incorrectly. When performing decoding of the codeword, the LLRs are propagated and updated between the variable nodes and the check nodes in a Tanner graph, which is representative of the parity check matrix of the LDPC code.

For LDPC decoding, the log likelihood ratio (LLR) of the received data bits in the codeword is used to decode the codeword. As such, after each bit position is measured and the 3-bit soft-decision data has been identified, the proper LLR associated with the soft-decision bits is extracted from a look-up table stored in the flash controller and the LLR is then fed to the LDPC decoder for subsequent decoding of the codeword. LLRs are a function of the shape and location of the voltage distribution for the flash cells and can be computed or measured in a characterization laboratory. The LLR values read from the LLR tables depend upon the soft-decision reference voltage locations used to read the encoded data from the nonvolatile memory.

In the present invention, an LLR look-up table need not be a physical entity, but may be considered in a broader sense to be a logical entity.

In the illustrated embodiment of FIG. 1, the flash cell is read using 7 reads, each read associated with a different soft-decision reference voltage 115 between −1V and +1V. The 7 read values are used to access an LLR table that is representative of the BER of the nonvolatile memory storage module to identify the soft-bits to be used by the LDPC decoder to recover the encoded codeword.

In an additional embodiment, the NAND storage element may be an n-bit multi-level cell (MLC) NAND flash memory which is capable of storing more than more than one bit of data. In a particular embodiment, the NAND flash memory device may be capable of storing 3 bits per cell, and is commonly referred to as a triple level cell (TLC).

The ability of the LDPC encoder and decoder to correct data errors introduced by the communication channel is an important performance parameter of the nonvolatile memory system. It is desirable be able to test the performance of an LDPC error correction circuit under various random noise conditions, such as an additive-white Gaussian noise (AWGN) channel, at a variety of different bit error rates (BER). When using an FPGA to test the LDPC error correction circuit for performance under an additive-white Gaussian noise (AWGN) channel, a circuit for generating AWGN samples is needed to generate the noise samples. The adding of AWGN to a channel requires the integration of the Gaussian curve to determine the amount of noise to be added. Over a plurality of noise samples, the aggregate of the samples will reconstruct the shape of the Gaussian curve. For example, the probability of a sample having the value x is the integral of the Gaussian curve between points x−a and x+a, as a approaches zero.

The soft-decision reference voltage reads performed during LDPC decoding have the effect of dividing the Gaussian curve into a plurality of regions. Each of these regions has an associated probability LLR that is a key aspect of LDPC error correction. As such, when testing and experimenting with LDPC circuits, it is necessary to identify which region a sample will fall into so that it's corresponding LLR can be determined. It is important that over a large number of samples, each region corresponds to the Gaussian error function that bounds that region. Generally, between 2 and 16 regions are define to cover area under the entire Gaussian curve. The sum of the probabilities of all the regions is equal to 1, indicating a 100% probability of every sample being in one of the defined regions.

Figure 2:
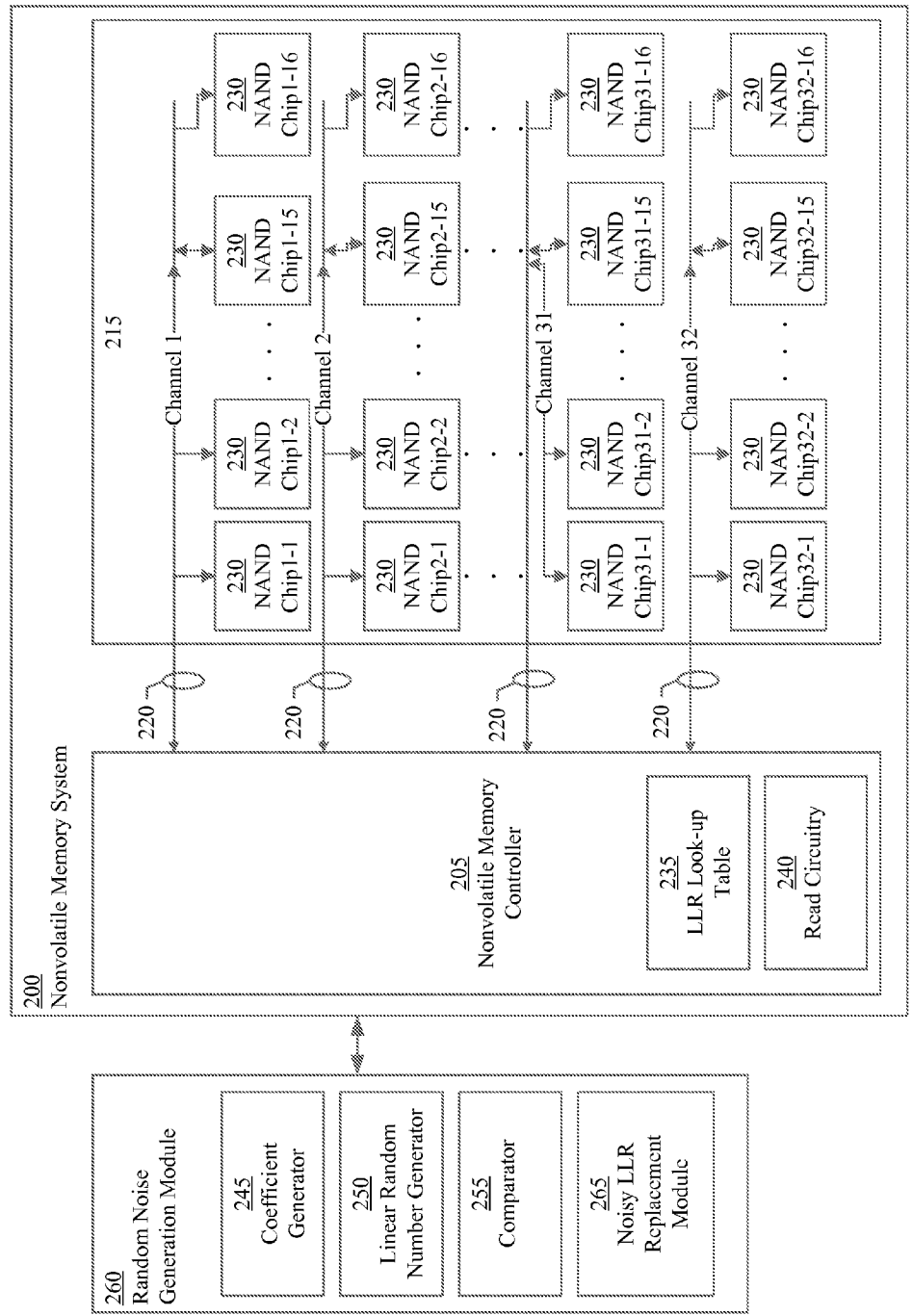
FIG. 2 is a block diagram illustrating the random noise generation module in accordance with an embodiment of the invention.

With reference to FIG. 2, a random noise generation module 260 is provided for generating noisy LLRs for testing an error correction circuit of a nonvolatile memory storage module 200. The random noise generation module 260 includes a coefficient generator 245 configured to generate a plurality of coefficients, each of the plurality of coefficients associated with one region of a plurality of regions defining a linear space proportionately divided according to an area under a probability distribution curve describing a nonvolatile memory storage module. The random noise generation module 260 further includes a linear random number generator 250 configured to generate a linear random number and a comparator 255 to compare the linear random number to one or more of the plurality of coefficients to identify the region of the plurality of regions of the probability distribution curve in which the linear random number belongs and a noisy LLR replacement module 265 to generate one or more noisy LLRs for testing an error correction circuit of a nonvolatile memory storage module 200.

In one embodiment, the random noise generation module 260 may generate AWGN noise samples that follow a Gaussian distribution curve. Alternatively, the random noise generation module 260 may generate noise samples that follow a variety of other distribution curves, provided that the area of interest under the curve is normalized to a value of 1. In an additional embodiment, the random noise generation module 260 may generate noise samples that follow a Black-Body Radiation curve. In an additional embodiment, the random noise generation module 260 may generate noise samples based upon curves derived from characterizing the actual flash memory chips used in the SSD.

The coefficient generator 245 of the random noise generation module 260 is configured to identify a probability distribution curve for the nonvolatile memory storage module 215. The probability distribution curve is dependent upon a desired bit error rate (BER) of the nonvolatile memory storage module to be tested. For example, the graph of FIG. 1 illustrates an AWGN probability distribution curve with a sigma of about 0.43 which describes a desired BER of $10^{-2}$ and illustrates when the two midpoints of the two curves that identify binary 0 and binary 1 are separated by a value of 2. The coefficient generator 245 is configured to divide the probability distribution curve into a plurality of regions. As shown with reference to FIG. 1, the regions are defined by the soft-decision reference voltages 115. The coefficient generator 245 is further configured to calculate the area under the probability distribution curve for each of the plurality of regions and to divide a linear space proportionately according to the area under the probability distribution curve for each of the plurality of regions to generate a plurality of coefficients, wherein each coefficient is associated with one region of the plurality of regions.

In an exemplary embodiment, 7 soft-decision reference voltages 115 are used to divide the area under the Gaussian curve into 8 regions, 7 regions to the left of each soft-decision reference voltage and a final region to the right of the last soft-decision reference voltage. The following table illustrates an example of the soft-decision reference voltages and the corresponding total calculated area under the Gaussian curve to the left of each associated soft-decision reference voltage. The table is calculated utilizing formulations commonly known in the art.

| Soft-Decision Reference Voltage | Area From −∞ to Soft-Decision Reference Voltage |
| --- | --- |
| −0.75 | 0.71916200482 |
| −0.50 | 0.87717993280 |
| −0.25 | 0.95931810178 |
| 0.00 | 0.98999999994 |
| 0.25 | 0.99819677289 |
| 0.50 | 0.99976226837 |
| 0.75 | 0.99997708862 |

The areas representing the total area of the Gaussian curve to the left of each of the soft-decision voltages that are calculated by the coefficient generator 245 are then translated into fractions of an assigned linear space to generate the coefficients for the random noise generation module 245. In an exemplary embodiment, if the assigned linear space is $2^{27}$ elements wide, then the coefficients are as illustrated in the following table.

| Soft-Decision Reference Voltage | Area From −∞ to Soft-Decision Reference Voltage | Coefficient | Regions |
| --- | --- | --- | --- |
| −0.75 | 0.71916200482 | 96524290 | 0 |
| −0.50 | 0.87717993280 | 117733097 | 1 |
| −0.25 | 0.95931810178 | 128757496 | 2 |
| 0.00 | 0.98999999994 | 132875550 | 3 |
| 0.25 | 0.99819677289 | 133975702 | 4 |
| 0.50 | 0.99976226837 | 134185820 | 5 |
| 0.75 | 0.99997708862 | 134214652 | 6 |
| | Covers area from 0.99997708862 to 1 | | 7 |

In the exemplary embodiment, for an assigned linear space that is $2^{27}$ elements wide, which is equivalent to a decimal value of 1324217728, the coefficient for each of the regions under the Gaussian curve is determined by dividing the linear space proportionately according to the area under the probability curve for each of the plurality of regions. For example, the coefficient for the first region is calculated as the product of the linear space and the area under the Gaussian curve probability distribution to the left of the −0.75 reference voltage (1324217728*0.17916200482=96524290).

After the coefficients have been generated by the coefficient generator 245, they are programmed into the random noise generation module 260. In the exemplary embodiment, 7 coefficients have been generated; however, if the random noise generation module 260 is capable of handling 15 coefficients, the final 8 coefficients may be programmed to the maximum value of $2^{27}$=1324217728. In another embodiment, the coefficients may be programmed to ($2^{27}$−1) which will reduce the width of the number by 1 bit. However, reducing the width by 1 bit results in multiple indistinguishable results when comparing the linear random number against the coefficients. To account for this condition, all of the bits, with the exception of the initial "one" bit, may be ignored during the comparison. Additionally, the invention can be implemented utilizing a single coefficient which is representative of a hard decode related to a hard-decision reference voltage.

The random noise generation module 260 includes a linear random number generator 250 configured to generate a linear random number. The linear random number generator 250 generates random numbers, wherein two pairs of random numbers are equi-probable. Circuits for generating linear random numbers are well known in the art and various implementations of the circuitry are within the scope of the present invention. In a particular embodiment, the linear random number generator 250 comprises a 27-bit LFSR (linear feedback shift register) circuit that generates 27-bit random numbers having a cycle of $2^{27}$. As such, for a 27-bit primitive polynomial, 27-bit random numbers can be generated and the bit sequence will be repeated 27 times before the 27-bit random numbers begin to repeat. In an additional embodiment, longer cycles can be generated utilizing a larger polynomial and the LFSR circuit.

In an alternative embodiment, instead of generating the random number with a linear random number generator 250, the random number may be read from a programmed nonvolatile memory storage module.

The random noise generation module 260 includes a comparator 255 to compare the linear random number to one or more of the plurality of coefficients to identify the region of the plurality of regions of the probability distribution curve in which the linear random number belongs, each of the plurality of regions having an associated noisy LLR. In identifying the region in which the random number belongs, the comparator 255 may perform a binary search or a linear search of the plurality of coefficients. In a particular embodiment, the comparator 255 performs a search of the 7 coefficients to determine the first coefficient that is less than the random number generated by the linear random number generator 250. The ordinal number of the first coefficient that is less than the random number determines the region of the Gaussian curve to which the random number belongs. If the random number is not less than any of the coefficients, it is considered to belong to the last region, which is equal to 7 in the exemplary embodiment.

In a specific embodiment, the comparator 255 is implemented as a binary search, given that the coefficients are determined in increasing value. The binary search of the exemplary embodiment includes:

| 1st Compare | 2nd Compare | 3rd Compare | |
|---|---|---|---|
| if (rand<c3) | if (rand < c1) | if (rand < c0) | region = 0 |
| | | else | region = 1 |
| | else | if (rand < c1) | region = 2 |
| | | else | region = 3 |
| else | if (rand < c5) | if (rand < c4) | region = 4 |
| | | else | region = 5 |
| | else | if (rand < c6) | region = 6 |
| | | else | region = 7 |

Where: rand is the random number from the linear random number generator 250
c0 . . . c6 are the coefficients generated by the coefficient generator 245
region is the region number to which the Gaussian sample belongs To perform the search illustrated in the exemplary embodiment shown above, the comparator 255 may include three cascaded compare circuits. The first compare circuit is configured to compare the LFSR generated random number against coefficient 3. Depending upon the outcome of that compare circuit, the second compare circuit is configured to compare the random number against either coefficient 1 or coefficient 5. Depending upon the outcome of the first compare circuit and the second compare circuit, the third compare circuit is configured to compare the random number against coefficients 0, 2, 4 or 6. The result of the third compare circuit will determine the region of the Gaussian curve that the random number belongs to, and as such the region of the generated AWGN sample.

In the present invention, multiple Gaussian samples can be simultaneously generated with a very wide LFSR implemented in the linear random number generator 250 and multiple search circuits implemented in the comparator 255. In an exemplary embodiment, a single 270-bit LFSR can generate ten 27-bit random numbers per clock cycle. These random numbers can then be compared to the coefficients generated by the coefficient generator 245 to identify the region they below to utilizing ten parallel search circuits in the comparator 255.

With reference to FIG. 2, the random noise generation module 260 may be coupled to, or integrated into, a nonvolatile memory system 200, such as a solid state drive. The nonvolatile memory system 200 may include a nonvolatile memory storage module 215 and a nonvolatile memory controller 205. The nonvolatile memory storage module 215 may comprise a plurality of NAND chips 230. Each of the plurality of NAND chips 230 may be coupled to the nonvolatile memory controller 205 through a plurality of channels 220. In this embodiment, the NAND chips 230 store the encoded codewords and the memory controller 205 is designed to execute reading and writing controls for the NAND chips 230 according to reading and writing instructions received from an access device. The nonvolatile memory controller 205 further includes a LLR look-up table 235 representative of the threshold voltage distribution of the memory storage module 215.

The nonvolatile memory controller 205 further includes read circuitry 240 for reading the codewords stored in the nonvolatile memory storage module 215. Each codeword read from the nonvolatile memory controller 205 comprises one or more binary samples. The noisy LLR replacement module 265 of the random noise generation module 260 replaces each of the binary samples in the codeword with a noisy LLR identified by the comparator 255 of the random noise generation module 260. As such, instead of extracting the LLR values for the samples of the codeword from an LLR look-up table of the nonvolatile memory storage module 215, the random noise generation module 260 generates noisy LLRs and replaces each of the binary values of the codeword read from the nonvolatile memory storage module 215 with one of a number of possible noisy LLRs generated by the random noise generation module 260 to impute noise into the codeword read from the nonvolatile memory storage module 215.

The random noise generation module 260 of the present invention may be used to test the error correction circuit for both a simulated flash and a real flash. A simulated flash exhibits ideal behavior and allows the error correction circuit to be tested before it is fully committed to an ASIC or FPGA to provide early identification of potentially faulty circuitry. In the case of a simulated flash, the random samples are modified with random noise generated by the random noise generation module 260. A real flash has inherent errors associated with a specific failure rate and the random noise generation module 260 injects errors by adding random noise to an already noisy system. Additionally, a real flash that is fairly new generally does not exhibit many errors. However, with the present invention, additional errors can be injected into the new flash data to simulate the increasing number of errors that may result as the flash ages. In both the simulated flash and the real flash implementations, the random noise generation module 260 injects errors into the channel by replacing the samples with noisy LLRs associated with the identified regions of the noise curve. The noisy LLRs are then used to test the ability of the error correction circuitry (i.e. LDPC decoder) of the nonvolatile memory system to correct errors generated by the random noise generation module 260.

In the exemplary embodiment of FIG. 1, the random noise generation module 260 is implemented utilizing two error curves, one curve representing the probability distribution when the bit is a programmed "1" and a second curve representing the probability distribution when the bit is a programmed "0". In an additional embodiment, the random noise generation module 260 may be implemented utilizing a single curve.

In an exemplary embodiment utilizing a single probability distribution curve, the curve describes the probability that the stored bit is actually a "1" when a "1" is read from the memory cell. As such, graphically, the single probability distribution curve is centered over "1" on the x-axis of a graph. However, since the memory can store either a "1" or a "0", it is necessary to know the probability that the stored bit is actually a "0" when a "0" is read from the memory cell. The probability distribution curve representative of a "0" value stored bit can be generated by symmetrically reflecting the probability distribution curve representative of a "1" value over zero on the x-axis, thereby creating a mirror reflection that centers over zero on the x-axis. As such, the implied curve for the probability distribution curve representative of a "0" value stored bit is equal to 1 minus the probability distribution curve representative of a "1" value stored bit.

To inject the noise into the channel, the memory cell is read and the probability distribution curve representing the amount of desired noise is applied to every bit that is read by replacing the bit with a noisy LLR. For example, if the bit read from the memory cell is a "1", then the "1" will be replaced by the value at a random point on the probability distribution curve representative of a "1" value stored bit. For a hard decode, and an associated hard-decision reference voltage, the probability distribution curve is divided into 2 regions and the replacement value resulting from the noise injection will be a 1 or a 0. For a soft decode, and an associated soft-decision reference voltage including 2 reads of the memory cell, the probability distribution curve is divided into 3 regions and the replacement value resulting from the noise injection will be two 1's, a 1 and a 0, or two 0's. If the bit read from the memory cell is a "0", instead of a "1", and using a single probability distribution curve that is centered over "1", the probability distribution curve centered over "0" can be derived by implementing 1 minus the probability distribution curve centered over "1". In other words, the two 1's will be converted into two 0's, the two 0's will be converted into two 1's and the one 1 and one 0 will remain the same. In this way, a single curve (centered over "1") can be used to inject noise into the sample values when either a "1" or a "0" is read from the memory cell. As such, if the probability distribution curve is representative of a binary "1" and the sample is a binary "1", then the probability distribution curve is used to generate the noisy LLR. However, if the probability distribution curve is representative of a binary "1" and the sample is a binary "0", then the mirrored image of the probability distribution curve is used to generate the noisy LLR.

In the case of a real flash, the probability distribution curve for a bit stored in a flash cell may be different depending upon whether the stored bit is a "1" or a "0". As such, the probability distribution curve centered over "1" is not symmetric with the probability distribution curve centered over "0". In this case, two sets of coefficients are utilized, one set of coefficients is used if the value read from the memory cell is a "1" and the other set is used if the value read from the memory cell is a "0", thereby eliminating the need to perform a "1 minus" procedure to derive the symmetric curve.

The noise injection of the present invention can be expanded to include 7 soft-decision reference voltages and 8 regions as previously described in the exemplary embodiment. In each case, only one read of the memory cell is performed and the resulting bits are converted into noisy bits commensurate with a desired number of soft-decision reference voltages representative of a plurality of reads of the data bits. Additionally, in the case of an MLC, wherein each memory cell stores two bits of data which corresponds to four states (11, 10, 01, 00), each state may be represented by a unique probability distribution curve. In this embodiment, four sets of coefficients could be implemented to inject the noise samples.

Figure 3:
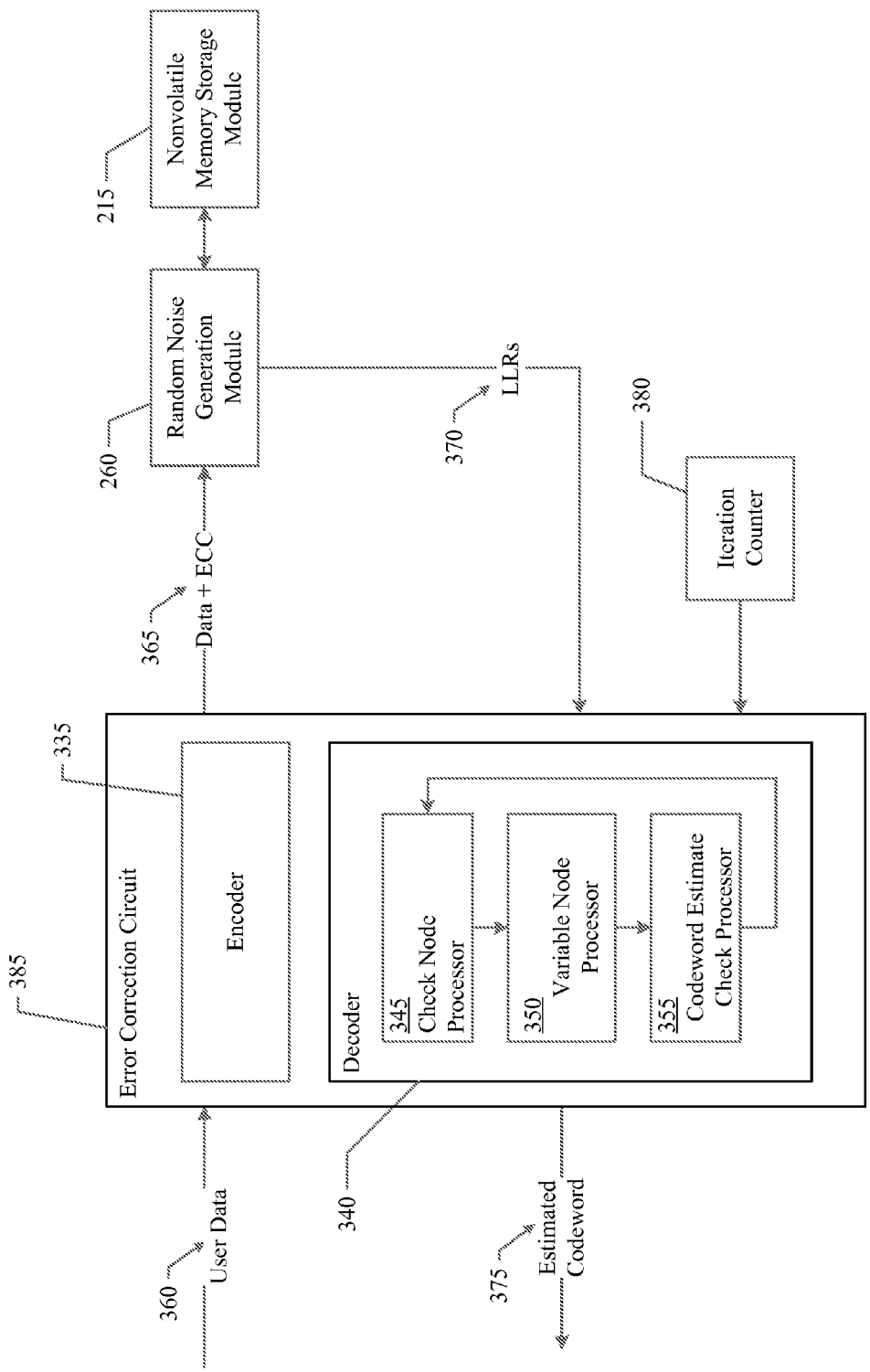
FIG. 3 is a block diagram illustrating a nonvolatile memory storage system in accordance with an embodiment of the invention.

The nonvolatile memory system 200 of FIG. 2 may be incorporated into a LDPC system as shown with reference to FIG. 3. As shown, the LDPC system includes an error correction circuit 385. In one embodiment, nonvolatile memory controller 205 includes an error correction circuit 385 that is an LDPC error correction circuit. The LDPC error correction circuit 385 includes an encoder 335 that is responsible for adding the parity bits to the user data 360 in accordance with a low-density parity check (LDPC) code. The LDPC encoded data 365, which includes the user data 360 and an error correction code, may then be stored as encoded codewords in the nonvolatile memory storage module 215. The random noise generation module 260 may then be used to generate random noise samples to modify the codewords stored in the nonvolatile memory storage module 215 in accordance with a probability distribution curve representative of a desired error rate as previously described. In a particular embodiment the nonvolatile memory storage module 215 may include a plurality of NAND chips 230 that are coupled to a nonvolatile memory controller 205 that is formed on an ASIC die that is coupled to the plurality of NAND chips.

To test the LDPC circuitry using the codewords stored in the nonvolatile memory storage module 215, a read operation of the nonvolatile memory storage module 215 is performed and the random noise generation module 260 generates noisy LLRs, as previously described. The noisy LLRs 370 are used as input to the LDPC decoder 340 to decode the user message data 360 encoded by the encoder 335 and modified by the random noise generation module 260, utilizing LDPC coding following a parity check matrix (H). The received LLR values for each variable node are taken as the initial variable node messages. The check node processor 345 updates the check nodes of a first layer with the variable node messages to which they are connected. The resulting messages of the check node processor 345 are then passed to the variable node processor 350 and the variable node processor 350 then updates each variable node with the check node messages to which they are connected. The iterative decoding process continues, as is known in the art, and the resulting codeword estimate is then checked by a codeword estimate check processor 355, to verify whether or not the codeword estimate is a valid codeword. In a particular embodiment, the codeword estimate may be multiplied by the parity check matrix to determine the syndrome and if the syndrome is zero, it may be determined that the codeword estimate is a valid codeword. If the codeword estimate is a valid codeword, the decoding is complete and the estimated codeword is provided as output 375 from the decoder 340. If it is determined by the codeword estimate check processor 355 that the codeword estimate is not a valid codeword, a second iteration of the decoding begins. The iteration counter 380 may be used to track the number of iterations of the decoding process and may cause the decoding to terminate if a maximum number of iterations is reached. As such, in the present invention, the LDPC error correction circuitry can be tested by injecting noise samples that follow a desired probability distribution curve into the data stored in the nonvolatile memory storage module.

In a particular embodiment of the present invention, LDPC decoding of the codeword is performed based upon a parity check matrix. The parity check matrix consists of "0"s and "1"s defining the parity check equations. For an "M" row× "N" column parity check matrix, M check nodes and N variable nodes iteratively exchange messages between each other according to the LDPC decoding algorithm. The "1"s in the parity check matrix define the connections between the variable nodes and the check nodes and the exchange of information is performed only between the nodes connected to each other as defined by the parity check matrix.

In operation of the present invention, a method of generating noisy LLRs for testing an error correction circuit of a nonvolatile memory storage module is provided. In general, the method includes generating a plurality of coefficients, each of the plurality of coefficients associated with one region of a plurality of regions defining a linear space proportionately divided according to an area under a probability distribution curve for a nonvolatile memory storage module, generating a linear random number and comparing the linear random number to one or more of the plurality of coefficients to identify the region of the plurality of regions of the probability distribution curve in which the linear random number belongs to generate noisy LLRs for testing an error correction circuit of a nonvolatile memory storage module.

Figure 4:
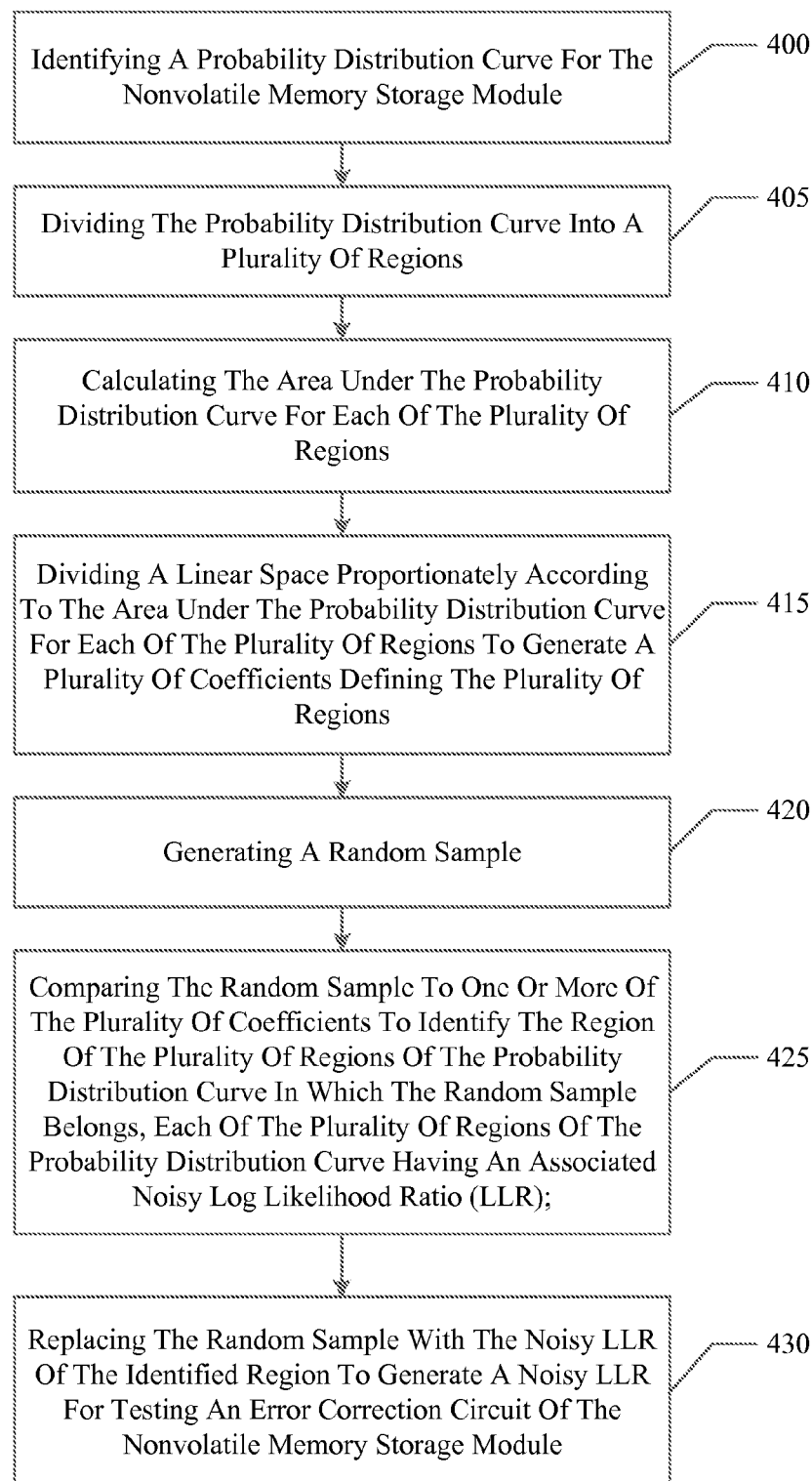
FIG. 4 is a flow diagram illustrating a method of generating noisy LLRs for testing an error correction circuit of a nonvolatile memory storage module in accordance with an embodiment of the invention.

With reference to FIG. 4, the method includes identifying a probability distribution curve for the nonvolatile memory storage module 400. The probability distribution curve is representative of the desired amount of error to be injected into the channel to enable the testing of the error correction circuit at a desired error rate. The desired amount of error and the associated probability distribution curve may be predetermined by a user of the system and may be selected based upon desired testing criteria. The probability distribution curve is provided to the random noise generation module 260. In one embodiment the probability distribution curve is entered by a user and is stored in random noise generation module 260 or in nonvolatile memory system 200.

After the probability distribution has been identified, the method proceeds by dividing the probability distribution curve into a plurality of regions 405, calculating the area under the probability distribution curve for each of the plurality of regions 410 and dividing a linear space proportionately according to the area under the probability distribution curve for each of the plurality of regions to generate a plurality of coefficients, each coefficient associated with one region of the plurality of regions 415. In one embodiment, the coefficient generator 245 of the random noise generation module 260 is configured for dividing the probability distribution curve into a plurality of regions 405, calculating the area under the probability distribution curve for each of the plurality of regions 410 and dividing a linear space proportionately according to the area under the probability distribution curve for each of the plurality of regions to generate a plurality of coefficients, each coefficient associated with one region of the plurality of regions 415. In the present embodiment the generated coefficients are stored in random noise generation module 260 or nonvolatile memory system 200.

After the coefficients have been generated by the coefficient generator 245, the method proceeds by generating a sample 420. The sample may be read from the nonvolatile memory system 200, or alternatively, the sample may be a linear random number. In one embodiment, the linear random number is generated by the linear random number generator 250 of the random noise generation module 260. In a particular embodiment, the linear random number generator 250 may be a linear feedback shift register (LFSR).

Following the generation of the linear random number, the method proceeds by comparing the sample to one or more of the plurality of coefficients to identify the region of the plurality of regions of the probability distribution curve in which the sample belongs 425. In one embodiment, the comparison is performed by the comparator 255 of the random noise generation module. Comparing the sample to one or more of the plurality of coefficients to identify the region of the plurality of regions of the probability distribution curve in which the linear random number belongs may include performing a linear search of the plurality of coefficients. In an alternate embodiment, comparing the sample to one or more of the plurality of coefficients to identify the region of the plurality of regions of the probability distribution curve in which the linear random number belongs may include performing a binary search of the plurality of coefficients.

As shown by step 430, the LLR of the identified region is applied to the sample to convert the sample into a noisy LLR for testing an error correction circuit of a nonvolatile memory storage module 430. In the present embodiment circuitry within the noisy LLR replacement module 265 is operable to replace the sample with the noisy LLR of the identified region to test the error correction circuit.

In one embodiment the a plurality of noisy LLRs are representative of the bits of a codeword and the noisy LLRs are provided to a decoder coupled to the random noise generation module, the decoder configured to recover the codeword from the noisy LLRs to test the error correction code circuit of the nonvolatile memory storage module. In one embodiment, random noise generation module 260 couples the noise samples to decoder 340 that is operable to generate an estimated codeword 375 from the noise samples. When error correction circuit 385 is unable to generate a valid estimated codeword 375 from the noise samples, an error results. In one embodiment random noise generation module 260 and decoder 340 are implemented in a FPGA, and dedicated error test circuitry is included in the FPGA that is operable to cause the FPGA circuitry to perform the steps of the methods shown in FIG. 4. In this embodiment, the dedicated test circuitry is operable to perform the steps of FIG. 4 numerous times and save the results.

Figure 5:
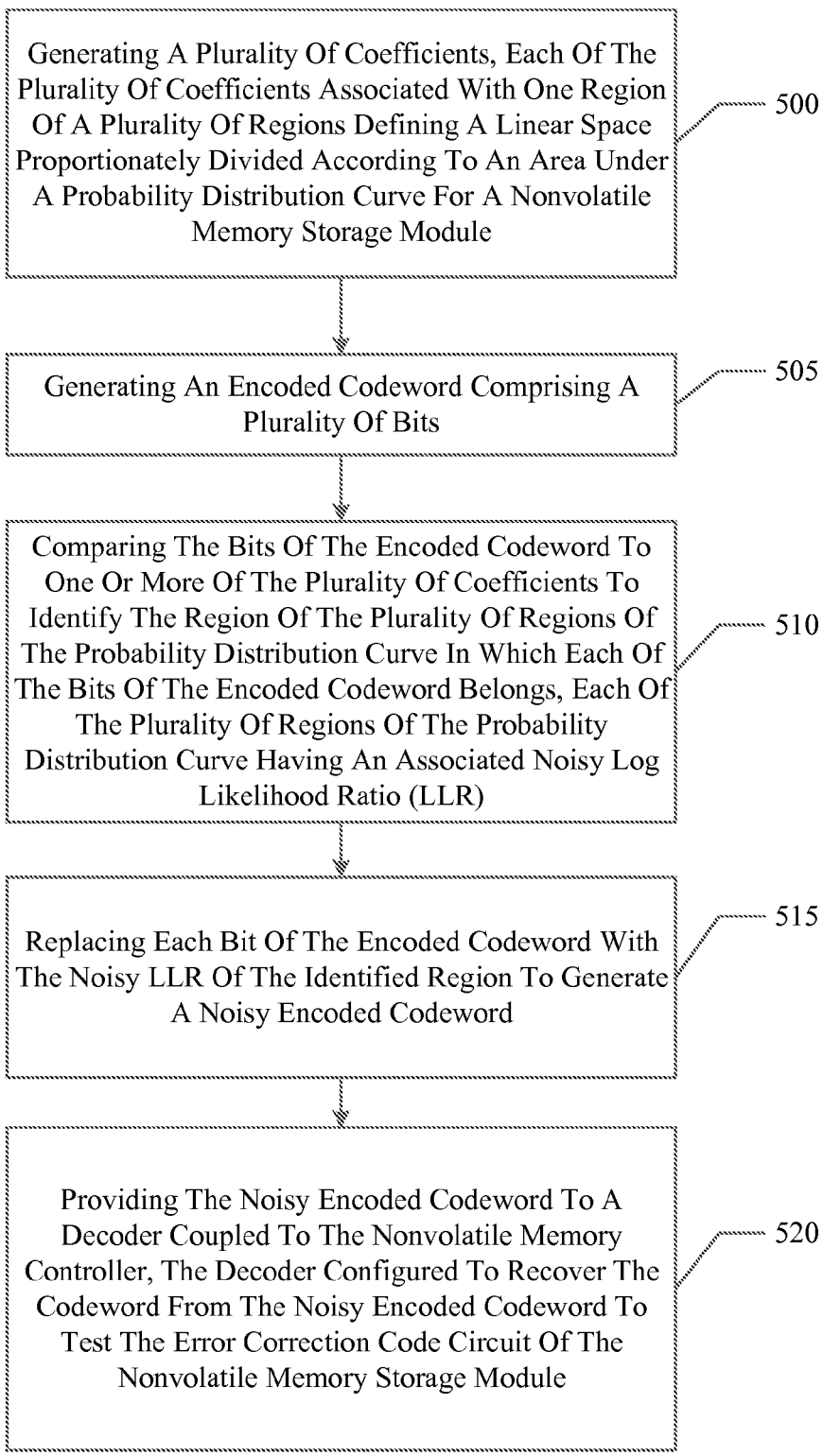
FIG. 5 is a flow diagram illustrating a method of testing an error correction circuit of a nonvolatile memory storage module in accordance with an embodiment of the invention.

With reference to FIG. 5, in one embodiment the method further includes a method for testing an error correction circuit of a nonvolatile memory storage module. The testing method includes generating a plurality of coefficients, each of the plurality of coefficients associated with one region of a plurality of regions defining a linear space proportionately divided according to an area under a probability distribution curve for a nonvolatile memory storage module 500. In one embodiment random noise generation module 260 is operable to perform step 500, with step 500 performed in the same manner as steps 400-415 of FIG. 4.

An encoded codeword, comprising a plurality of bits, is then generated 505 from a sequence of samples read from a memory chip or generated by a simulated process, and the method further includes comparing the samples representative of the bits of the encoded codeword to one or more of the plurality of coefficients to identify the region of the plurality of regions of the probability distribution curve in which each of the bits of the encoded codeword belongs, each of the plurality of regions of the probability distribution curve having an associated noisy log likelihood ratio (LLR) 510. In the embodiment shown in FIG. 2, nonvolatile memory system 200 is operable to generate the encoded codeword, and random noise generation module 260 is operable to identify the region of the plurality of regions of the probability distribution curve in which the samples representative of the bits of the encoded codeword belongs. In another embodiment, the non-parity portion of the codeword may be generated using a random number generator as is described in step 420 of FIG. 4 and encoding techniques known in the art may be used to generate the parity portion of the codeword and to generate the encoded codeword from the parity and non-parity portions.

Following identification of the region, the method further includes, replacing each bit of the encoded codeword with the noisy LLR of the identified region to the sample to generate a noisy encoded codeword for testing an error correction circuit of a nonvolatile memory storage module 515. In the present embodiment, random noise generation module 260 is operable to replace the bits of the encoded codeword with the noisy LLR of the identified region to generate the noisy encoded codeword. In one specific embodiment, circuitry within the noisy LLR replacement module 265 is operable to replace the bits of the encoded codeword with the noisy LLRs of the identified regions.

Referring now to step 520, the noisy codeword is provided to a decoder coupled to the random noise generation module, the decoder configured to receive the noisy encoded codeword from the random noise generation module and configured to recover the codeword from the noisy encoded codeword to test the error correction code circuit of the nonvolatile memory storage module 520. In one embodiment, random noise generation module 260 couples the noisy encoded codeword to error correction circuit 385 that is operable to generate an estimated codeword 375 from the noisy LLRs 370 representative of the noisy encoded codeword. When error correction circuit 385 is unable to generate a valid estimated codeword 375 from the noisy LLRs, an error results. In one embodiment dedicated error test circuitry may be included in an FPGA or ASIC and coupled to a programmable processing system that generates the coefficients via a software program, rather than complex hardware, and the test circuitry is operable to cause the FPGA circuitry to perform the steps of the methods shown in FIG. 5. In this embodiment, the dedicated test circuitry is operable to perform the steps of the methods shown in FIG. 5 numerous times and save the results. In one embodiment, the dedicated test circuitry is included in random noise generation module 260.

Error correction is a key discriminating feature of SSDs and flash controllers and being able to test error correction circuits to determine whether or not they meet the desired objectives requires noise generation and injection into the channel.

In FPGA solutions of random number generators known in the art, the circuits are so large that often a separate FPGA is dedicated to noise generation for the testing of error correction circuitry under AWGN. The size of the circuitry limits the number of samples that can be generated per clock cycle as a result of the limited number of pins connecting the noise generation FPGA to the FPGA comprising the error correction circuitry. Additionally, the prior art solutions for generating random numbers are complex.

In accordance with the present invention, a random noise generation module is provided that converts a simple random number into a Gaussian sample without the use of complex circuitry. The circuitry for the random noise generation module of the present invention is minimal and may therefore be integrated onto the same FPGA that includes the encoding and decoding circuitry for a nonvolatile memory system.

In various embodiments, the system of the present invention may be implemented in a Field Programmable Gate Array (FPGA) or Application Specific Integrated Circuit (ASIC) suitable for the design of encoders/decoders for LDPC codes.

In one embodiment, both random noise generation module 260 and nonvolatile memory controller 200 are implemented in a single integrated circuit die (e.g., a FPGA) that is coupled to nonvolatile memory storage modules 215. In another embodiment, random noise generation module 260 and associated test circuitry is implemented in a single integrated circuit die (e.g., a FPGA) that is coupled to nonvolatile memory controller 200 and nonvolatile memory storage modules 215 that are formed on separate die (e.g., ASIC die).

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method of generating a noisy log likelihood ratio (LLR) for testing an error correction circuit of a nonvolatile memory storage module, the method comprising:
    identifying a probability distribution curve to be used to test an error correction circuit of a nonvolatile memory storage module, wherein the probability distribution curve is representative of a desired bit error rate (BER) of a nonvolatile memory storage module;
    generating a plurality of coefficients from the probability distribution curve, each of the plurality of coefficients associated with one region of a plurality of regions defining a linear space proportionately divided according to an area under the probability distribution curve;
    generating a random sample;
    comparing the random sample to one or more of the plurality of coefficients to identify the region of the plurality of regions of the probability distribution curve in which the random sample belongs, each of the plurality of regions of the probability distribution curve having an associated noisy log likelihood ratio (LLR); and replacing the random sample with the noisy LLR of the identified region to generate a noisy LLR for testing the error correction circuit of the nonvolatile memory storage module.

2. The method of claim 1, wherein generating a plurality of coefficients, each of the plurality of coefficients associated with one region of a plurality of regions defining a linear space proportionately divided according to an area under a probability distribution curve for a nonvolatile memory storage module, further comprises:
   dividing the probability distribution curve into a plurality of regions;
   calculating the area under the probability distribution curve for each of the plurality of regions;
   dividing a linear space proportionately according to the area under the probability distribution curve for each of the plurality of regions to generate a plurality of coefficients, the plurality of coefficients defining the plurality of regions.

3. The method of claim 1, wherein generating a random sample further comprises reading a sample from the nonvolatile memory storage module.

4. The method of claim 1, wherein generating a random sample further comprises generating a linear random number.

5. The method of claim 1, wherein the probability distribution curve is an additive white Gaussian noise (AWGN) probability distribution curve.

6. The method of claim 1, wherein the error correction circuit is a low-density parity-check (LDPC) error correction circuit.

7. The method of claim 1, wherein comparing the random sample to one or more of the plurality of coefficients to identify the region of the plurality of regions of the probability distribution curve in which the random sample belongs further comprises, performing a linear search of the plurality of coefficients.

8. The method of claim 1, wherein comparing the random sample to one or more of the plurality of coefficients to identify the region of the plurality of regions of the probability distribution curve in which the random sample belongs further comprises, performing a binary search of the plurality of coefficients.

9. A random noise generation module for generating a noisy log likelihood ratio (LLR) for testing an error correction circuit of a nonvolatile memory storage module, the random noise generation module comprising:
   a coefficient generator configured to generate a plurality of coefficients, each of the plurality of coefficients associated with one region of a plurality of regions defining a linear space proportionately divided according to an area under a probability distribution curve for a nonvolatile memory storage module, wherein the probability distribution curve is representative of a desired bit error rate (BER) of a nonvolatile memory storage module to be used to test an error correction circuit of the nonvolatile memory storage module;
   a comparator configured to compare a random sample received at the random noise generation module to one or more of the plurality of coefficients to identify the region of the plurality of regions of the probability distribution curve in which the random sample belongs, each of the plurality of regions of the probability distribution curve having an associated noisy log likelihood ratio (LLR); and
   a noisy LLR replacement module configured to replace the random sample with the noisy LLR of the identified region to generate a noisy LLR for testing an error correction circuit of the nonvolatile memory storage module.

10. The random noise generation module of claim 9, wherein the coefficient generator is further configured to identify a probability distribution curve for the nonvolatile memory storage module, to divide the probability distribution curve into a plurality of regions, to calculate the area under the probability distribution curve for each of the plurality of regions and to divide a linear space proportionately according to the area under the probability distribution curve for each of the plurality of regions to generate a plurality of coefficients, the plurality of coefficients defining the plurality of regions.

11. The random noise generation module of claim 9, wherein the random sample is a sample read from the nonvolatile memory storage module.

12. The random noise generation module of claim 9, further comprising a linear random number generator and wherein the random sample is a linear random number generated by the linear random number generator.

13. The random noise generation module of claim 9, wherein the probability distribution curve is an additive white Gaussian noise (AWGN) probability distribution curve.

14. The random noise generation module of claim 9, wherein the nonvolatile memory storage module is a NAND-based flash memory module.

15. The random noise generation module of claim 9, wherein the error correction circuit is a low-density parity-check (LDPC) error correction circuit.

16. The random noise generation module of claim 9, wherein comparing the random sample to one or more of the plurality of coefficients to identify the region of the plurality of regions of the probability distribution curve in which the random sample belongs further comprises, performing a binary search of the plurality of coefficients.

17. The random noise generation module of claim 9, wherein comparing the random sample to one or more of the plurality of coefficients to identify the region of the plurality of regions of the probability distribution curve in which the random sample belongs further comprises, performing a linear search of the plurality of coefficients.

18. A system for testing an error correction circuit of a nonvolatile memory storage module, the system comprising:
   a random noise generation module for generating a noisy log likelihood ratio (LLR) for testing an error correction circuit of a nonvolatile memory storage module, the random noise generation module comprising;
   a coefficient generator configured to identify a probability distribution curve for the nonvolatile memory storage module, wherein the probability distribution curve is representative of a desired bit error rate (BER) of a nonvolatile memory storage module to be used to test the error correction circuit of the nonvolatile memory storage module, the coefficient generator further configured to divide the probability distribution curve into a plurality of regions, to calculate the area under the probability distribution curve for each of the plurality of regions and to divide a linear space proportionately according to the area under the probability distribution curve for each of the plurality of regions to generate a plurality of coefficients, each of the plurality of regions of the probability distribution curve having an associated noisy log likelihood ratio (LLR);
   a comparator configured to compare a random sample received at the system to one or more of the plurality of coefficients to identify the region of the plurality of regions of the probability distribution curve in which the random sample belongs;

a noisy LLR replacement module configured to replace the random sample with a noisy LLR of the identified region to generate a noisy LLR; and a decoder configured to receive the noisy LLR from the nonvolatile memory controller and configured to decode an encoded codeword stored in the nonvolatile memory storage module to test the error correction code circuit of the nonvolatile memory storage module.

19. The system of claim 18, wherein the random noise generation module and the decoder are fabricated on the same integrated circuit die.

20. A method for testing an error correction circuit of a nonvolatile memory controller, the method comprising:

identifying a probability distribution curve to be used to test an error correction circuit of a nonvolatile memory storage module, wherein the probability distribution curve is representative of a desired bit error rate (BER) of a nonvolatile memory storage module;

generating a plurality of coefficients, from the probability distribution curve, each of the plurality of coefficients associated with one region of a plurality of regions defining a linear space proportionately divided according to an area under the probability distribution curve;

generating an encoded codeword comprising a plurality of bits;

comparing the bits of the encoded codeword to one or more of the plurality of coefficients to identify the region of the plurality of regions of the probability distribution curve in which each of the bits of the encoded codeword belongs, each of the plurality of regions of the probability distribution curve having an associated noisy log likelihood ratio (LLR);

replacing each bit of the encoded codeword with the noisy LLR of the identified region to generate a noisy encoded codeword; and providing the noisy encoded codeword to a decoder coupled to the random noise generation module, the decoder configured to recover the codeword from the noisy encoded codeword to test the error correction code circuit of the nonvolatile memory storage module.

* * * * *